(12) United States Patent
Fujiwara et al.

(10) Patent No.: US 7,785,765 B2
(45) Date of Patent: Aug. 31, 2010

(54) PHOTOSENSITIVE RESIN COMPOSITION

(75) Inventors: Masahiro Fujiwara, Tokyo (JP); Kenji Doi, Tokyo (JP); Yoshifumi Araki, Tokyo (JP); Kazuyoshi Yamazawa, Tokyo (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 217 days.

(21) Appl. No.: 11/913,173

(22) PCT Filed: Apr. 28, 2006

(86) PCT No.: PCT/JP2006/308946

§ 371 (c)(1),
(2), (4) Date: Oct. 30, 2007

(87) PCT Pub. No.: WO2006/120935

PCT Pub. Date: Nov. 16, 2006

(65) Prior Publication Data

US 2009/0068593 A1    Mar. 12, 2009

(30) Foreign Application Priority Data

May 11, 2005  (JP) .............................. 2005-138108
Oct. 14, 2005  (JP) .............................. 2005-300275

(51) Int. Cl.
G03F 7/00    (2006.01)
G03F 7/004   (2006.01)
G03F 7/09    (2006.01)

(52) U.S. Cl. ................. 430/270.1; 430/302; 430/281.1; 430/905

(58) Field of Classification Search ................ 430/302, 430/270.1, 905, 281.1
See application file for complete search history.

(56) References Cited

U.S. PATENT DOCUMENTS

| | | | |
|---|---|---|---|
| 4,894,315 A | | 1/1990 | Feinberg et al. |
| 4,994,344 A | | 2/1991 | Kurtz et al. |
| 5,135,837 A | | 8/1992 | Swatton |
| 5,278,220 A | * | 1/1994 | Vermeire et al. ............. 524/490 |
| 5,397,822 A | * | 3/1995 | Lee, Jr. ........................ 524/127 |
| 5,603,872 A | * | 2/1997 | Margalit ....................... 264/4.3 |
| 6,025,098 A | * | 2/2000 | Sakurai et al. ................. 430/18 |
| 6,037,101 A | | 3/2000 | Telser et al. |
| 6,284,431 B1 | | 9/2001 | Tanizaki et al. |
| 6,720,373 B2 | * | 4/2004 | Lin et al. ..................... 524/284 |
| 7,432,037 B2 | * | 10/2008 | Suzuki et al. ............ 430/286.1 |
| 2004/0234886 A1 | | 11/2004 | Rudoph et al. |
| 2005/0239930 A1 | | 10/2005 | Clair et al. |

FOREIGN PATENT DOCUMENTS

| | | |
|---|---|---|
| EP | 0 326 977 A2 | 8/1989 |
| EP | 0 696 761 A1 | 2/1996 |
| EP | 0 859 284 A1 | 8/1998 |
| EP | 1 555 571 A1 | 7/2005 |
| JP | 2-108632 | 4/1990 |
| JP | 4-342258 | 11/1992 |
| JP | 7-271031 | 10/1995 |
| JP | 10-73921 | 3/1998 |
| JP | 10-221850 | 8/1998 |
| JP | 10-288838 | 10/1998 |
| JP | 11-153 865 | 6/1999 |
| JP | 2000-155418 | 6/2000 |
| JP | 2004-162050 | 6/2004 |
| JP | 2004-302447 | 10/2004 |
| WO | WO 01/68769 A1 | 9/2001 |

OTHER PUBLICATIONS

Machine translation of JP 2004-162050 (no date).*
Machine translation of JP 10-288838 (no date).*
European Search Report for EP Application No. 06745827.3-2222 dated Feb. 24, 2010.

* cited by examiner

*Primary Examiner*—Amanda C. Walke
(74) *Attorney, Agent, or Firm*—Finnegan, Henderson, Farabow, Garrett & Dunner, L.L.P.

(57) ABSTRACT

The present invention relates to a photosensitive resin composition comprising at least a thermoplastic elastomer (a), a photopolymerizable unsaturated monomer (b), and a photopolymerization initiator (c), characterized in that the thermoplastic elastomer (a) comprises at least vinyl aromatic hydrocarbon units, butadiene units, and alkylene units and contains alkylene units not less than 5 wt % and not more than 80 wt % with respect to the total amount of butadiene units and alkylene units. The present invention provides a photosensitive resin composition that simultaneously achieves excellent fine line reproducibility, ester solvent resistance, and prevention of cracks occurring on plate surface.

21 Claims, No Drawings

PHOTOSENSITIVE RESIN COMPOSITION

TECHNICAL FIELD

The present invention relates to a photosensitive resin composition particularly preferably used in a flexographic printing plate.

BACKGROUND ART

General photosensitive resin compositions for flexography commonly comprise an unhydrogenated thermoplastic elastomer, a photopolymerizable unsaturated monomer, and a photopolymerization initiator, as described in Patent Documents 1 to 3.

Raw plates for flexography comprise a support such as a polyester film and the photosensitive resin composition laminated thereon. Further, a slipping layer or protective layer is provided on the photosensitive resin composition, if necessary, for the purpose of achieving smooth contact with a negative film. Alternatively, an ultraviolet blocking layer containing an infrared-sensitive substance which can be cut off by an infrared laser is sometimes provided on the photosensitive resin composition.

A method for preparing a flexographic printing plate from such a raw plate for flexography involves initially subjecting the whole surface of the raw plate to ultraviolet exposure through a support (back exposure) to provide a thin uniform cured layer thereon; subsequently subjecting the surface of a photosensitive resin layer to relief exposure through a negative film or through an ultraviolet blocking layer cut off by an infrared laser; and finally washing out unexposed parts with a solvent for development or removing unexposed parts by the absorption of an absorbing layer after heating and melting, and conducing post-exposure.

Printing using the flexographic printing plate prepared with the photosensitive resin is carried out by supplying inks containing an ester solvent or the like onto the surfaces of convex parts of the resin plate having concaves and convexes by use of an ink-supplying roll or the like, and next bringing the printing plate into contact with a substrate to be printed on to transfer the inks on the surfaces of the convex parts to the substrate to be printed on.

The flexography described above presents such problems that: a printing plate capable of reproducing exact shape onto a negative film (fine line reproducibility) is not obtained; cracks occur on plate surface during printing due to a large post-exposure light amount; a printing plate swells and chips (chipping resistance) during long-duration printing or its washing and parts other than original patterns are also printed due to lack of ester solvent resistance. Various solutions have been proposed to such problems of the photosensitive resin composition.

In Example 1 of Patent Document 3, a styrene-isoprene block copolymer is used as a polymer in a photosensitive resin. A photosensitive resin using this polymer has relatively good resistance to ester solvents. However, the photosensitive resin contains isoprene and therefore, does not necessarily have sufficient prevention of cracks occurring on plate surface and abrasion resistance.

In Patent Document 4, a terpolymer having randomly distributed ethylene, propylene, and diene units is used as a polymer in a photosensitive resin. However, a photosensitive resin plate using this polymer does not necessarily have sufficient fine line reproducibility. Patent Documents 5 to 7 propose a block copolymer having alkylene units as a polymer in a photosensitive resin. In Examples therein, a block copolymer having a styrene block, an alkylene block, and an isoprene block is illustrated. However, all of these photosensitive resins comprise the alkylene block not less than 99 wt % with respect to the total amount of butadiene units and alkylene units and therefore, do not necessarily have sufficient fine line reproducibility, chipping resistance, and prevention of cracks occurring on plate surface.

Patent Document 1: JP-A-2000-155418
Patent Document 2: JP-A-02-108632 (corresponding U.S. Pat. No. 4,894,315)
Patent Document 3: JP-A-04-342258 (corresponding U.S. Pat. No. 5,135,837)
Patent Document 4: European Patent No. 0326977 (corresponding U.S. Pat. No. 4,994,344)
Patent Document 5: JP-A-10-288838 (corresponding U.S. Pat. No. 6,037,101)
Patent Document 6: JP-A-10-73921
Patent Document 7: U.S. Patent No. 20050239930

DISCLOSURE OF THE INVENTION

Problems to be Solved by the Invention

A technical object of the present invention is to provide a photosensitive resin composition with (1) high fine line reproducibility, (2) high ester solvent resistance, and (3) few cracks occurring on plate surface.

Means for Solving the Problems

The present inventor has conducted diligent studies for attaining the object and has consequently completed the present invention by finding out that the object can be attained by using a novel photosensitive resin composition described below.

Specifically, the present invention is as follows:

(1) A photosensitive resin composition comprising at least a thermoplastic elastomer (a), a photopolymerizable unsaturated monomer (b), and a photopolymerization initiator (c), characterized in that the thermoplastic elastomer (a) comprises at least vinyl aromatic hydrocarbon units, butadiene units, and alkylene units and contains alkylene units not less than 5 wt % and not more than 80 wt % with respect to the total amount of butadiene units and alkylene units.

(2) The photosensitive resin composition according to (1), characterized in that the thermoplastic elastomer (a) contains alkylene units not less than 10 wt % and not more than 50 wt % with respect to the total amount of butadiene units and alkylene units.

(3) The photosensitive resin composition according to (1), characterized in that the thermoplastic elastomer (a) contains alkylene units not less than 10 wt % and not more than 40 wt % with respect to the total amount of butadiene units and alkylene units.

(4) The photosensitive resin composition according to any one of (1) to (3), characterized in that the thermoplastic elastomer (a) comprises a block mainly composed of vinyl aromatic hydrocarbon units and a block mainly composed of butadiene units and alkylene units and contains alkylene units not less than 5 wt % and not more than 80 wt % with respect to the amount of the block mainly composed of butadiene units and alkylene units.

(5) The photosensitive resin composition according to any one of (1) to (4), characterized in that the thermoplastic elastomer (a) is obtained by hydrogenating a block copolymer of a polymer block mainly composed of vinyl aromatic hydrocarbon units and a polymer block mainly composed of butadiene units.

(6) The photosensitive resin composition according to any one of (1) to (5), characterized in that the amount of vinyl aromatic hydrocarbon units in the thermoplastic elastomer (a) is not less than 10 wt % and not more than 40 wt %.

(7) The photosensitive resin composition according to any one of (1) to (6), characterized in that the amount of 1,2-bond units from butadiene contained in the thermoplastic elastomer (a) is not less than 1 wt % and not more than 70 wt %.

(8) The photosensitive resin composition according to any one of (1) to (7), characterized in that the total amount of 1,2-bond units from butadiene and butylene units contained in the thermoplastic elastomer (a) ranges from not less than 20 wt % to not more than 80 wt %.

(9) The photosensitive resin composition according to any one of (1) to (8), characterized in that the photosensitive resin composition comprises the thermoplastic elastomer (a) in an amount not less than 10 wt % and not more than 85 wt %, the photopolymerizable unsaturated monomer (b) in an amount not less than 0.5 wt % and not more than 50 wt %, and the photopolymerization initiator (c) in an amount not less than 0.1 wt % and not more than 45 wt %, when the amounts of the thermoplastic elastomer (a), the photopolymerizable unsaturated monomer (b), and the photopolymerization initiator (c) are summed up.

(10) The photosensitive resin composition according to any one of (1) to (9), characterized in that the photosensitive resin composition comprises a conjugated diene rubber containing 1,2-bond units in an amount not less than 40 mol % and having a viscosity not more than 2,000 (Pa·s) at 30° C.

(11) The photosensitive resin composition according to (10), characterized in that all kinds of the conjugated diene rubbers in the photosensitive resin composition contain 1,2-bond units not less than 40 mol % on average, and having a viscosity is not more than 2,000 (Pa·s) at 30° C.

(12) The photosensitive resin composition according to any one of (1) to (11), characterized in that the photosensitive resin composition comprises a conjugated diene rubber having a viscosity not more than 2,000 (Pa·s) at 30° C. in an amount not less than 4 parts by weight and not more than 40 parts by weight with respect to 100 parts by weight in total of the amounts of the thermoplastic elastomer (a), the photopolymerizable unsaturated monomer (b), and the photopolymerization initiator (c).

(13) A raw plate for flexography having a layer comprising a photosensitive resin composition according to any one of (1) to (12).

(14) The raw plate for flexography according to (13), further having an ultraviolet blocking layer on the layer of the photosensitive resin composition.

ADVANTAGES OF THE INVENTION

The photosensitive resin composition of the present invention simultaneously achieves fine line reproducibility, ester solvent resistance, and the prevention of cracks occurring on plate surface.

BEST MODE FOR CARRYING OUT THE INVENTION

Hereinafter, the present invention will be described specifically.

Raw plates for flexography commonly comprise a support layer, at least one photosensitive resin layer, a slipping layer, an ultraviolet blocking layer which can be cut off by an infrared laser, and so on. The present invention relates to this photosensitive resin composition.

A thermoplastic elastomer (a) in the photosensitive resin composition of the present invention refers to that comprising at least vinyl aromatic hydrocarbon units, butadiene units, and alkylene units and containing 5 wt % to 80 wt % of alkylene units with respect to the total amount of butadiene units and alkylene units.

Alkylene units in the thermoplastic elastomer (a) refers to a monoolefin unit such as an ethylene unit, propylene unit, butylene unit, or hexylene unit. The content of alkylene units in the total amount of butadiene units and alkylene units in the thermoplastic elastomer (a) needs to be not more than 80 wt % from the viewpoint of fine line reproducibility, chipping resistance, and the prevention of cracks occurring on plate surface. On the other hand, the content of alkylene units in the total amount of butadiene units and alkylene units needs to be not less than 5 wt % from the viewpoint of suppressing the thickness change of a printing plate attributed to ester solvent swelling. The content is preferably not less than 10 wt % and not more than 60 wt %, more preferably not less than 10 wt % and not more than 50 wt %, most preferably not less than 10 wt % and not more than 40 wt %.

In the present invention, butadiene is used because it is preferable from the viewpoint of the durability of a printing plate. Butadiene may also be used in combination with isoprene.

The content of butadiene units in the thermoplastic elastomer (a) is preferably not less than 10 wt % from the viewpoint of fine line reproducibility. On the other hand, the content is preferably not more than 85 wt % from the viewpoint of ester solvent resistance. More preferably, the content ranges from 35 wt % to 85 wt %, even more preferably 50 wt % to 70 wt %.

Examples of vinyl aromatic hydrocarbon units include a styrene unit, a p-methylstyrene unit, a tertiary butylstyrene unit, an α-methylstyrene unit, and a 1,1-diphenylethylene unit. Among others, the styrene unit is preferable. These units may exact alone or in combination of two or more of them.

The content of vinyl aromatic hydrocarbon units in the thermoplastic elastomer (a) is preferably not more than 40 wt % from the viewpoint of the moldability of the photosensitive resin composition, chipping resistance, and the prevention of reduction in hardness of a printing plate attributed to the attachment of flexographic ink components. On the other hand, the content is preferably not less than 10 wt % from the viewpoint of the cold flow resistance of a raw plate for flexography. More preferably, the content ranges from 13 wt % to 25 wt %, even more preferably 14 wt % to 24 wt %, particularly preferably 16 wt % to 23 wt %.

The weight-average molecular weight of the thermoplastic elastomer (a) is preferably not less than 150,000 from the viewpoint of the cold flow resistance of a raw plate for flexography and chipping resistance. On the other had, the weight-average molecular weight is preferably not more than 500,000 from the viewpoint of the moldability of the photosensitive resin and the flexibility of a printing plate. More preferably, the weight-average molecular weight ranges from not less than 200,000 to 400,000, even more preferably 250,000 to 350,000.

The thermoplastic elastomer (a) is preferably a block copolymer from the viewpoint of processability. Preferable block species are a polymer block mainly composed of vinyl aromatic hydrocarbon units, a polymer block mainly composed of butadiene units, a polymer block mainly composed of butadiene units and alkylene units, and a polymer block mainly composed of alkylene from the viewpoint of economical efficiency. Furthermore, it is preferred that the thermoplastic elastomer (a) should comprise a polymer block mainly composed of vinyl aromatic hydrocarbon units and a polymer block mainly composed of butadiene units and alkylene units, from the viewpoint of compatibility with the photopolymerizable monomer and an optionally added plasticizer and of chipping resistance.

In the present invention, the "polymer block mainly composed of the A unit" means that the block contains the A (monomer) unit not less than 60 wt %.

The content of the monomer mainly composing the block is more preferably not less than 80 wt %, even more preferably not less than 90 wt %, most preferably not less than 95 wt %. When the polymer block mainly composed of butadiene units is, for example, a copolymer of vinyl aromatic hydrocarbon and butadiene, vinyl aromatic hydrocarbon units in the polymer block may be distributed evenly or may be distributed unevenly (e.g., in a tapered form). Plural parts of the evenly distributed vinyl aromatic hydrocarbon units and/or the unevenly distributed vinyl aromatic hydrocarbon units may coexist in each block.

The thermoplastic elastomer (a) is, for example, a linear block copolymer represented by the following general formula:

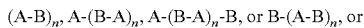

a linear block copolymer or radial block copolymer represented by the following general formula:

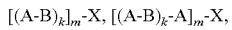

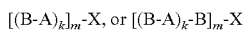

(wherein A represents a polymer block mainly composed of vinyl aromatic hydrocarbon units, B represents a polymer block mainly composed of butadiene units and alkylene units, X represents a residue of a coupling agent (e.g., silicon tetrachloride, tin tetrachloride, epoxidized soybean oils, polyhalogenated hydrocarbon compounds, carboxylic ester compounds, polyvinyl compounds, bisphenol-type epoxy compounds, alkoxysilane compounds, halogenated silane compounds, and ester-based compounds) or a residue of an initiator (e.g., polyfunctional organic lithium compounds), each of n, k, and m represents an integer not less than 1 and generally represents 1 to 5). Alternatively, the structures represented by the general formulas may be combined arbitrarily. The compounds as coupling agents may be used alone or as a mixture of two or more of them. The thermoplastic elastomer (a) is preferably a block copolymer of two or more polymer blocks mainly composed of vinyl aromatic hydrocarbon units and one or more polymer block(s) mainly composed of butadiene units and alkylene units from the viewpoint of the cold flow resistance of a raw plate for flexography, fine line reproducibility, and abrasion resistance.

The weight-average molecular weight of the polymer block mainly composed of butadiene units and alkylene units in the thermoplastic elastomer (a) is preferably 20,000 to 250,000 from the viewpoint of the cold flow resistance of a raw plate for flexography and chipping resistance. The weight-average molecular weight is more preferably 30,000 to 200,000, even more preferably 40,000 to 150,000.

The weight-average molecular weight of the polymer block mainly composed of vinyl aromatic hydrocarbon units in the thermoplastic elastomer (a) is preferably not more than 100,000 from the viewpoint of fine line reproducibility and is preferably not less than 3,000 from the viewpoint of the cold flow resistance of a raw plate for flexography. More preferably, the weight-average molecular weight ranges from 5,000 to 80,000, even more preferably 5,000 to 60,000.

The amount of alkylene units with respect to the total amount of the polymer block mainly composed of butadiene units and alkylene units is preferably not more than 80 wt % from the viewpoint of the transparency of the photosensitive resin composition and chipping resistance. On the other hand, the amount is preferably not less than 5 wt % from the viewpoint of the ozone resistance of a printing plate. The amount is more preferably not less than 10 wt % and not more than 60 wt %, even more preferably not less than 10 wt % and not more than 50 wt %.

Furthermore, the amount of 1,2-bond units from butadiene contained in the thermoplastic elastomer (a) is preferably not less than 1 wt % and not more than 70 wt % from the viewpoint of fine line reproducibility and chipping resistance. The amount is more preferably not less than 10 wt % and not more than 60 wt %, even more preferably not less than 20 wt % and not more than 50 wt %.

Furthermore, the total amount of 1,2-bond units from butadiene and butylene units contained in the thermoplastic elastomer (a) is preferably not less than 20 wt % and not more than 80 wt % in consideration of the moldability of the photosensitive resin composition. The total amount is more preferably not less than 30 wt % and not more than 70 wt %, even more preferably not less than 40 wt % and not more than 65 wt %.

The 1,2-bond unit of butadiene described in the present invention refers to a bond unit in which butadiene forms a 1,2-bond and has a remaining unsaturated bond in the side chain.

A method for producing the thermoplastic elastomer (a) is not particularly limited and is preferably, from the viewpoint of economical efficiency, a method comprising hydrogenating an unsaturated bond of a block copolymer of a block mainly composed of vinyl aromatic hydrocarbon units and a block mainly composed of butadiene units.

The block copolymer before hydrogenation can be produced by a publicly known technique known in the art and is obtained, for example, by polymerizing styrene and butadiene with an organic lithium compound as a polymerization initiator in an inactive hydrocarbon solvent. A linear block copolymer is obtained by this method.

Furthermore, an appropriate coupling agent can also be added in a predetermined amount to the organic lithium compound in the polymerization system to obtain a block copolymer having a radial structure.

A hydrogenation method is not particularly limited and is performed by a publicly known technique. After the completion of hydrogenation, the polymerization solvent is separated and removed from the product by, for example, steam stripping, followed by drying to obtain the thermoplastic elastomer (a).

Moreover, the thermoplastic elastomer (a) may be added with an arbitrary antioxidant, if desired.

Examples of the antioxidant include: hindered phenolic compounds such as 2,4-bis(n-octylthiomethyl)-o-cresol, 2,4-bis(n-dodecylthiomethyl)-o-cresol, 2,4-bis(phenylthiomethyl)-3-methyl-6-tert-butylphenol, n-octadecyl-3-(3',5'-di-tert-butyl-4'-hydroxyphenyl) propionate, 2,2'-methylenebis (4-ethyl-6-tert-butylphenol), tetrakis [methylene-3-(3',5'-di-tert-butyl-4'-hydroxyphenyl)propionate]-methane, 1,3,5-trimethyl-2,4,6-tris(3,5-di-tert-butyl-4-hydroxybenzyl) benzene, 2,6-di-tert-butyl-p-methylphenol, 2,6-di-tert-butyl-4-ethylphenol, 2-tert-butyl-6-(3-tert-butyl-2-hydroxy-5-methylbenzyl)-4-methylphenyl acrylate, 2,4-di-tert-amyl-6-[1-(3,5-di-tert-amyl-2-hydroxyphenyl)ethyl]phenyl acrylate, 2-[1-(2-hydroxy-3,5-di-tert-pentylphenyl)-ethyl]-4,6-di-tert-pentylphenyl acrylate, and 3,9-bis[2-[3-(3-tert-butyl-4-hydroxy-5-methylphenyl)-propionyloxy]-1,1-dimethyl-ethyl]-2,4,8,10-tetraoxaspiro[5,5]undecane; sulfur-based compounds such as pentaerythritol-tetrakis-(β-lauryl-thio-propionate), dilauryl-3,3'-thiodipropionate, dimyristyl-3,3'-thiodipropionate, and distearyl-3,3'-thiodipropionate; and phosphorous-based compounds such as tris(nonylphenyl) phosphite, cyclic neopentanetetraylbis(octadecylphosphite), and tris(2,4-di-tert-butylphenyl) phosphite. These antioxidants can be used alone or in combination of two or more of them. The amount of these antioxidants added is arbitrarily determined and is preferably not more than 3 parts by weight with respect to 100 parts by weight of the thermoplastic elastomer (a).

Examples of the photopolymerizable unsaturated monomer (b) include: esters of acrylic acid, methacrylic acid, fumaric acid, and maleic acid; derivatives of acrylamide and methacrylamide; allyl esters; styrene and its derivatives; and N-substituted maleimide compounds.

Specific examples thereof can include: diacrylates and dimethacrylates of alkanediols such as hexanediol and nonanediol; diacrylates and dimethacrylates of ethylene glycol, diethylene glycol, propylene glycol, dipropylene glycol, polyethylene glycol, butylene glycol, neopentyl glycol, and tricyclodecanedimethanol; and trimethylolpropane tri(meth) acrylate, dimethyloltricyclodecane di(meth)acrylate, isobornyl (meth)acrylate, phenoxypolyethylene glycol (meth) acrylate, pentaerythritol tetra(meth)acrylate, N,N'-hexamethylenebisacrylamide and N,N'-hexamethylenebismethacrylamide, styrene, vinyltoluene, divinylbenzene, diacryl phthalate, triallyl cyanurate, diethyl fumarate, dibutyl fumarate, dioctyl fumarate, distearyl fumarate, butyl octyl fumarate, diphenyl fumarate, dibenzyl fumarate, dibutyl maleate, dioctyl maleate, bis(3-phenylpropyl) fumarate, dilauryl fumarate, diphenyl fumarate, and N-laurylmaleimide. These photopolymerizable unsaturated monomers may be used alone or in combination of two or more of them.

The photopolymerization initiator (c) in the present invention refers to a compound that absorbs light energy and generates radicals. A variety of publicly known photopolymerization initiators can be used. Preferable photopolymerization initiators are a variety of organic carbonyl compounds, particularly, aromatic carbonyl compounds.

Specific examples thereof include: benzophenone, 4,4-bis (diethylamino)benzophenone, t-butylanthraquinone, 2-ethylanthraquinone, and thioxanthones such as 2,4-diethylthioxanthone, isopropylthioxanthone, and 2,4-dichlorothioxanthone; acetophenones such as diethoxyacetophenone, 2-hydroxy-2-methyl-1-phenylpropane-1-one, benzyl dimethyl ketal, 1-hydroxycyclohexyl phenyl ketone, 2-methyl-2-morpholino(4-thiomethylphenyl) propane-1-one, and 2-benzyl-2-dimethylamino-1-(4-morpholinophenyl)-butanone; benzoin ethers such as benzoin methyl ether, benzoin ethyl ether, 2,2-dimethoxy-phenylacetophenone, benzoin isopropyl ether, and benzoin isobutyl ether; acylphosphine oxides such as 2,4,6-trimethylbenzoyl diphenyl phosphine oxide, bis(2,6-dimethoxybenzoyl)-2,4, 4-trimethyl pentyl phosphine oxide, and bis(2,4,6-trimethylbenzoyl)-phenyl phosphine oxide; methylbenzoyl formate; 1,7-bisacridinylheptane; and 9-phenylacridine. These photopolymerization initiators may be used alone or in combination of two or more of them.

It is preferred as to contents in the photosensitive resin composition that the photosensitive resin composition should comprise the thermoplastic elastomer (a) in an amount not less than 10 wt % and not more than 85 wt %, the photopolymerizable unsaturated monomer (b) in an amount not less than 0.5 wt % and not more than 50 wt %, and the photopolymerization initiator (c) in an amount not less than 0.1 wt % and not more than 45 wt % with respect to the total of the amounts of the thermoplastic elastomer (a), the photopolymerizable unsaturated monomer (b), and the photopolymerization initiator (c).

The content of the thermoplastic elastomer (a) is preferably not less than 10 wt % from the viewpoint of ester solvent resistance and chipping resistance and is preferably not more than 85 wt % from the viewpoint of flexibility. More preferably, the content ranges from 30 wt % to 80 wt %, even more preferably 60 wt % to 80 wt %.

The content of the photopolymerizable unsaturated monomer (b) is preferably not less than 0.5 wt % from the viewpoint of fine line reproducibility and is preferably not more than 30 wt % from the viewpoint of the cold flow resistance of a raw plate for flexography and the flexibility of a printing plate. More preferably, the content ranges from 1 wt % to 15 wt %.

The content of the photopolymerization initiator (c) is preferably not less than 0.1 wt % from the viewpoint of fine line reproducibility and is preferably not more than 10 wt % from the viewpoint of the transmittance of active light such as ultraviolet rays. More preferably, the content ranges from 0.5 wt % to 5 wt %.

One or more thermoplastic elastomer(s) other than the thermoplastic elastomer (a) may be used in combination therewith as long as the content thereof is not more than 100 parts by weight with respect to 100 parts by weight in total of the amounts of the thermoplastic elastomer (a), the photopolymerizable unsaturated monomer (b), and the photopolymerization initiator (c). A styrenic thermoplastic elastomer is preferable from the viewpoint of availability and compatibility. Specific examples thereof include a styrene-butadiene block copolymer, a styrene-isoprene block copolymer, a styrene-ethylene/butylene block copolymer, and a styrene-ethylene/propylene block copolymer.

In addition, it is preferred that a plasticizer (d) should be added in a range of 4 parts by weight to 40 parts by weight with respect to 100 parts by weight in total of the components (a), (b), and (c), from the viewpoint of the moldability of the resin composition and the flexibility of a printing plate.

Examples of the plasticizer include: hydrocarbon oils such as naphthenic oils and paraffin oils; liquid conjugated diene rubbers such as liquid acrylonitrile-butadiene copolymers and liquid styrene-butadiene copolymers; polystyrene having a weight-average molecular weight not more than 2,000; and sebacate and phthalate. These compounds may have a photopolymerizable reaction group.

Among them, a liquid conjugated diene rubber having a viscosity not more than 2,000 (Pa·s) at 30° C. is preferable from the viewpoint of the flexibility of a printing plate and fine line reproducibility.

Conjugated diene in the conjugated diene rubber is preferably isoprene or butadiene from the viewpoint of availability and is more preferably butadiene from the viewpoint of chipping resistance.

Two or more conjugated diene rubbers may be used in combination.

When two or more conjugated diene rubbers are used in combination, the amount of a 1,2-bond unit contained in at least one of the conjugated diene rubbers is preferably not less than 40 mol % from the viewpoint of fine line reproducibility, chipping resistance, and ester solvent resistance. The amount is more preferably not less than 60 mol %, even more preferably not less than 80 mol %. When two or more conjugated diene rubbers are used in combination, the amount of 1,2-bond units in all the conjugated diene rubbers is preferably not less than 40 mol % on average from the viewpoint of ester solvent resistance. The amount is more preferably not less than 60 mol %, even more preferably not less than 70 mol %, on average.

The weight-average molecular weight (Mw) of the conjugated diene rubber is preferably not more than 50,000 from the viewpoint of handling properties and compatibility with the photosensitive resin composition and is preferably not less than 1,000 from the viewpoint of chipping resistance. More preferably, the weight-average molecular weight ranges from 2,000 to 35,000, even more preferably 3,000 to 20,000.

During printing, a flexographic printing plate on a printing press is brought into contact with a substrate to be printed. Too soft a printing plate does not provide fine printed matters due to compression deformation. By contrast, too hard a printing plate does not provide printed matters having uniform solid surface. Therefore, it is preferred that a printing plate of 2.5 mm in thickness should have Shore A hardness ranging from not less than 50° to not more than 68°.

The photosensitive resin composition of the present invention can be supplemented additionally with various auxiliary additive components such as a thermal polymerization inhibitor, an ultraviolet absorbent, an antihalation agent, and a photostabilizer.

A raw plate for flexography of the present invention can be prepared by a variety of methods.

For example, raw materials of the photosensitive resin composition are dissolved in an appropriate solvent, for example, chloroform, tetrachloroethylene, methyl ethyl ketone, or toluene, and then mixed. The solution can be cast into a mold and prepared in a plate form as it is by evaporating the solvent. Alternatively, the solvent is not used, and the raw materials can be kneaded in a kneader, roll mill, or screw extruder and then formed into a desired thickness with a calender roll, press, or the like. However, the present invention is not limited to these preparation methods.

It is preferred that the raw plate for flexography of the present invention should have an ultraviolet blocking layer comprising an infrared-sensitive substance which can be cut off by an infrared laser.

Photosensitive resin compositions usually have tackiness. Therefore, a solvent-soluble thin flexible protection layer (see e.g., JP-B-05-13305) may be provided on the photosensitive resin layer surface for preventing adhesion to a negative film overlapped thereon in platemaking and permitting for reuse of the negative film.

Washing-out liquid-soluble compound such as polyamide, partially saponified polyvinyl acetate, and cellulose ester, is dissolved in an appropriate solvent, and the photosensitive resin layer may be coated directly with this solution to provide a thin flexible protection layer on the surface of the photosensitive resin layer. Alternatively, a film such as polyester or polypropylene is coated with the solution, and then, this film (protection film) may be transferred to the photosensitive layer by lamination or press bonding.

After sheeting the photosensitive resin composition, the protection film and a support can be brought into tight contact with the photosensitive resin composition by roll-lamination and heat-pressed to obtain a photosensitive resin layer having a further highly precise thickness.

Alternatively, it is preferred that the ultraviolet blocking layer should be placed as this flexible protection layer. This flexible protection layer itself may be used as a negative by direct drawing. In any case, this thin flexible protection layer is removed simultaneously with unexposed parts by washing out after the completion of exposure.

A method for preparing a flexographic printing plate from the raw plate for flexography generally involves initially subjecting the whole surface of the raw plate to ultraviolet exposure through a support (back exposure) to provide a thin uniform cured layer thereon; subsequently subjecting the surface of a photosensitive resin layer to relief exposure through a negative film or through an ultraviolet blocking layer cut off by an infrared laser; and finally washing out unexposed parts with a solvent for development or absorption removing unexposed parts with an absorbing layer after heating and melting, and conducing post-exposure Either of the exposure from the negative film side (relief exposure) or the exposure from the support side (back exposure) may be performed first. Alternatively, both of them may be performed simultaneously.

Examples of an exposure light source include high pressure mercury lamps, ultraviolet fluorescent lamps, carbon arc lamps, and xenon lamps.

Examples of a developing solvent used for developing unexposed parts can include: esters such as heptyl acetate and 3-methoxybutyl acetate; hydrocarbons such as petroleum fractions, toluene, and decalin; and mixtures of chlorine-based organic solvents (e.g., tetrachloroethylene) and alcohols (e.g., propanol, butanol, and pentanol).

The washing-out of unexposed parts is performed by injection from a nozzle or brushing with a brush.

A method generally performed as post-exposure involves irradiating the surface with light not more than 300 nm in wavelength. Light not less than 300 nm in wavelength may be used in combination therewith, if necessary.

EXAMPLES

Hereinafter, the present invention will be described more specifically with reference to measurement methods, Reference Examples, Examples, and Comparative Examples. However, the present invention is not limited to these Examples.

[Measurement Method]

(Viscosity)

Measurement was conducted according to JIS-K-7117.

(UV)

A chloroform solution was prepared at a concentration of 0.15 wt %. The styrene content of a block copolymer before hydrogenation was calculated at absorbance of 254 nm using an ultraviolet spectrophotometer (manufactured by Shimadzu Corp., UV-2450).

(IR)

A carbon disulfide solution was prepared at a concentration of 0.05 wt %. The amount of a 1,2-bond unit in a block copolymer before hydrogenation was calculated at absorbance of 911 cm$^{-1}$ (Hampton method) using an infrared spectrophotometer (manufactured by JASCO Corporation, FT/IR-230).

(GPC)

An apparatus and two columns used were LC-10 (trade name, manufactured by Shimadzu Corp.) and TSKgel GMHXL (4.6 mm ID×30 cm), respectively. Measurement was conducted with tetrahydrofuran (1.0 ml/min) as a solvent at an oven temperature of 40° C.

A weight-average molecular weight (Mw) in the present application was calculated as a polystyrene-equivalent molecular weight.

(NMR)

A measurement apparatus and a solvent used were JNM-LA400 (trade name, manufactured by JEOL Ltd.) and deuterated chloroform, respectively. Measurement was conducted under conditions involving a sample concentration of 50 mg/ml, an observation frequency of 400 MHz, TMS (tetramethyl silane) as a chemical shift standard, a pulse delay of 2.904 sec., scanning 64 times, a pulse width of 45°, and a measurement temperature of 26° C. The amounts of vinyl aromatic hydrocarbon units, 1,4- and 1,2-bond units of butadiene, an ethylene unit, and butylene units were measured by $^1$H-NMR.

REFERENCE EXAMPLES (1) Synthesis of Thermoplastic Elastomer (1-1) Hydrogenated Thermoplastic Elastomer A Air in a 10 L stainless steel reaction vessel equipped with a jacket and a stirrer was sufficiently substituted with nitrogen. Then, 7,000 cc of cyclohexane, 1 g of tetrahydrofuran, 0.5 g of N,N,N',N'-tetramethylethylenediamine, and 75 g of styrene were charged into the reaction vessel. The contents were set to at approximately 70° C. by circulating hot water through the jacket. Then, the polymerization of styrene was initiated by the addition of a cyclohexane solution of n-butyllithium (0.68 g in pure content). Styrene was completely polymerized, and 850 g of butadiene (1,3-butadiene) was then added thereto to continue polymerization. Butadiene was completely polymerized, and 75 g of styrene was then added thereto to continue polymerization.

An part of the obtained block copolymer solution was sampled. The solvent was removed from the sample by heating. The resulting polymer had a styrene unit in an amount of 15 wt % and 1,2-bond units from butadiene in an amount of 40 wt %.

Next, the remaining block copolymer solution was used to perform hydrogenation at a temperature of 70° C. using biscyclopentadienyl titanium chloride and n-butyllithium as hydrogenation catalysts. A hydrogenation ratio was controlled by measuring the amount of hydrogen gas supplied with a flowmeter and terminating gas supply at the point in time when the target hydrogenation ratio was achieved. Then, 10 g of water was added thereto. After stirring, 3.0 g of n-octadecyl-3-(3',5'-di-tert-butyl-4'-hydroxyphenyl) propionate, 1.5 g of 2,4-bis(n-octylthiomethyl)-o-cresol were added thereto. The solvent was removed from the obtained solution by steam stripping to obtain a hydrous crumb. Subsequently, the crumb was dehydrated and dried with a heat roll to obtain a block copolymer containing butadiene units with hydrogenated double bonds and alkylene units. The hydrogenation ratio was 45 mol %. Moreover, the amount of alkylene units was 46 wt % with respect to the total amount of butadiene units and alkylene units. The weight-average molecular weight of the polymer was 160,000.

(1-2) Hydrogenated Thermoplastic Elastomer B

Air within a 10 L stainless steel reaction vessel equipped with a jacket and a stirrer was sufficiently substituted with nitrogen. Then, 7,000 cc of cyclohexane, 1 g of tetrahydrofuran, 3.7 g of N,N,N',N'-tetramethylethylenediamine, and 170 g of styrene were charged into the reaction vessel. The contents were set to at approximately 70° C. by circulating hot water through the jacket. Then, the polymerization of styrene was initiated by the addition of a cyclohexane solution of n-butyllithium (1.15 g in pure content). Styrene was completely polymerized, and 830 g of butadiene (1,3-butadiene) was then added thereto to continue polymerization. Four minutes later after butadiene was completely polymerized, 0.83 g of tetramethoxysilane was added thereto to perform coupling reaction. An aliquot of the obtained block copolymer solution was sampled. Then, the solvent was removed from the sample by heating. The resulting polymer had a styrene unit in an amount of 17 wt % and 1,2-bond units from butadiene in an amount of 57 wt %.

Next, the remaining block copolymer solution was used to perform hydrogenation at a temperature of 70° C. using bis-cyclopentadienyl titanium chloride and n-butyllithium as hydrogenation catalysts. A hydrogenation ratio was controlled by measuring the amount of hydrogen gas supplied with a flowmeter and terminating gas supply at the point in time when the target hydrogenation ratio was achieved. Then, 10 g of water was added thereto. After stirring, 3.0 g of n-octadecyl-3-(3',5'-di-tert-butyl-4'-hydroxyphenyl) propionate, 1.5 g of 2,4-bis(n-octylthiomethyl)-o-cresol were added thereto. The solvent was removed from the obtained solution by steam stripping to obtain a hydrous crumb. Subsequently, the crumb was dehydrated and dried with a heat roll to obtain a block copolymer containing butadiene units with hydrogenated double bonds and alkylene units. The hydrogenation ratio was 23 mol %. Moreover, the amount of alkylene units was 23 wt % with respect to the total amount of butadiene units and alkylene units. The weight-average molecular weight of the block copolymer (except for the diblock) in the polymer was 280,000.

Moreover, the amount of styrene-(butadiene/alkylene) diblock in the polymer was 22 wt %.

(1-3) Hydrogenated Thermoplastic Elastomer C

Air within a 10 L stainless steel reaction vessel equipped with a jacket and a stirrer was sufficiently substituted with nitrogen. Then, 7,000 cc of cyclohexane, 1 g of tetrahydrofuran, 3.9 g of N,N,N',N'-tetramethylethylenediamine, and 170 g of styrene were charged into the reaction vessel. The contents were set to at approximately 70° C. by circulating hot water through the jacket. Then, the polymerization of styrene was initiated by the addition of a cyclohexane solution of n-butyllithium (1.15 g in pure content). Styrene was completely polymerized, and 830 g of butadiene (1,3-butadiene) was then added thereto to continue polymerization. Four minutes later after butadiene was completely polymerized, 0.83 g of tetramethoxysilane was added thereto to perform coupling reaction. An aliquot of the obtained block copolymer solution was sampled. Then, the solvent was removed from the sample by heating. The resulting polymer had a styrene unit in an amount of 17 wt % and 1,2-bond units from butadiene in an amount of 60 wt %.

Next, the remaining block copolymer solution was used to perform hydrogenation at a temperature of 70° C. using bis-cyclopentadienyl titanium chloride and n-butyllithium as hydrogenation catalysts. A hydrogenation ratio was controlled by measuring the amount of hydrogen gas supplied with a flowmeter and terminating gas supply at the point in time when the target hydrogenation ratio was achieved. Then, 10 g of water was added thereto. After stirring, 3.0 g of n-octadecyl-3-(3',5'-di-tert-butyl-4'-hydroxyphenyl) propionate, 1.5 g of 2,4-bis(n-octylthiomethyl)-o-cresol were added thereto. The solvent was removed from the obtained solution by steam stripping to obtain a hydrous crumb. Subsequently, the crumb was dehydrated and dried with a heat roll to obtain a block copolymer containing butadiene units with hydrogenated double bonds and alkylene units. The hydrogenation ratio was 53 mol %. Moreover, the amount of alkylene units was 54 wt % with respect to the total amount of butadiene units and alkylene units. The weight-average molecular weight of the block copolymer (except for the diblock) in the polymer was 280,000.

Moreover, the amount of styrene-(butadiene/alkylene) diblock in the polymer was 22 wt %.

(1-4) Hydrogenated Thermoplastic Elastomer D

Air within a 10 L stainless steel reaction vessel equipped with a jacket and a stirrer was sufficiently substituted with nitrogen. Then, 7,000 cc of cyclohexane, 1 g of tetrahydrofuran, 3.9 g of N,N,N',N'-tetramethylethylenediamine, and 170 g of styrene were charged into the reaction vessel. The contents were set to at approximately 70° C. by circulating hot water through the jacket. Then, the polymerization of styrene was initiated by the addition of a cyclohexane solution of n-butyllithium (1.15 g in pure content). Styrene was completely polymerized, and 830 g of butadiene (1,3-butadiene) was then added thereto to continue polymerization. 4 minutes after butadiene was completely polymerized, 0.83 g of tetramethoxysilane was added thereto to perform coupling reaction. An aliquot of the obtained block copolymer solution was sampled. Then, the solvent was removed from the sample by heating. The resulting polymer had a styrene unit in an amount of 17 wt % and a 1,2-bond unit from butadiene in an amount of 60 wt %.

Next, the remaining block copolymer solution was used to perform hydrogenation at a temperature of 70° C. using bis-cyclopentadienyl titanium chloride and n-butyllithium as hydrogenation catalysts. The amount of hydrogen gas supplied was measured with a flowmeter, and reaction was terminated at the point in time when quantitative hydrogenation was achieved. Then, 10 g of water was added thereto. After stirring, 3.0 g of n-octadecyl-3-(3',5'-di-tert-butyl-4'-hydroxyphenyl) propionate, 1.5 g of 2,4-bis(n-octylthiomethyl)-o-cresol were added thereto. The solvent was removed from the obtained solution by steam stripping to obtain a hydrous crumb. Subsequently, the crumb was dehydrated and dried with a heat roll to obtain a block copolymer containing butadiene units with hydrogenated double bonds and alkylene units. The hydrogenation ratio was 99 mol %. Moreover, the amount of alkylene units was 99 wt % with respect to the total amount of butadiene units and alkylene units. The weight-average molecular weight of the block copolymer (except for the diblock) in the polymer was 280,000.

Moreover, the amount of styrene-(butadiene/alkylene) diblock in the polymer was 22 wt %.

(1-5) Unhydrogenated Thermoplastic Elastomer E

Air within a 10 L stainless steel reaction vessel equipped with a jacket and a stirrer was sufficiently substituted with nitrogen. Then, 7,000 cc of cyclohexane, 1 g of tetrahydrofuran, and 75 g of styrene were charged into the reaction vessel. The contents were set to at approximately 70° C. by circulating hot water through the jacket. Then, the polymerization of styrene was initiated by the addition of a cyclohexane solution of n-butyllithium (0.68 g in pure content). Styrene was completely polymerized, and 850 g of butadiene (1,3-butadiene) was then added thereto to continue polymerization. Butadiene was completely polymerized, and 75 g of styrene was then added thereto to continue polymerization. After the completion of polymerization, 10 g of water was added thereto. After stirring, 3.0 g of n-octadecyl-3-(3',5'-di-tert-butyl-4'-hydroxyphenyl) propionate, 1.5 g of 2,4-bis(n-octylthiomethyl)-o-cresol were added thereto. The solvent was removed from the obtained solution by steam stripping to obtain a hydrous crumb. Subsequently, the crumb was dehydrated and dried with a heat roll to obtain an unhydrogenated thermoplastic elastomer E having a weight-average molecular weight of 160,000. The unhydrogenated thermoplastic elastomer E had a styrene unit in an amount of 15 wt % and 1,2-bond units from butadiene in an amount of 13 wt %.

(2) Preparation of Photosensitive Resin Composition and Raw Plate for Flexography A photosensitive resin composition was formulated with a thermoplastic elastomer (a), a photopolymerizable unsaturated monomer (b), a photopolymerization initiator (c), and plasticizers (d) according to composition shown in Table 1. Moreover, 1.3 parts by weight of 2,6-di-t-butyl-p-cresol was mixed therewith as an antioxidant with respect to 100 parts by weight in total of the thermoplastic elastomer (a), the photopolymerizable unsaturated monomer (b), and the photopolymerization initiator (c). These were kneaded at 140° C. for 60 minutes in a kneader to obtain a photosensitive resin composition. B2000 (trade mark, manufactured by NIPPON SODA CO., LTD.) used as the plasticizers (d) is liquid conjugated diene rubbers having a viscosity of 80 (Pa·s) at 30° C. LIR305 (trade mark, manufactured by KURARAY CO., LTD.) used as the plasticizers (d) is a viscosity of 200 (Pa·s) at 30° C. The obtained photosensitive resin composition was sandwiched between a polyester film support of 125µ in thickness coated with a thermoplastic elastomer-containing adhesive and a 100-µ polyester coversheet having a polyamide layer of 4µ in thickness, and pressed using a 3-mm spacer at a pressure of 200 kg/cm for 4 minutes under conditions of 130° C. to form a raw plate for flexography.

(3) Preparation of Flexographic Printing Plate

The coversheet was peeled off from the raw plate for flexography obtained in the above (2). A negative film was brought into tight contact with the protection layer of polyamide provided on the photosensitive resin layer. Exposure on the whole surface was first conducted at an integrated exposure light amount of 300 mJ/cm$^2$ to 500 MJ/cm$^2$ from the support side using an ultraviolet fluorescent lamp having a center wavelength of 370 nm on an exposing machine AFP-1500 (trade name, manufactured by Asahi Kasei Chemicals Corp.) so as to achieve a relief depth of 0.85 mm. Subsequently, relief exposure was conducted at an integrated exposure light amount of 6,000 mJ/cm$^2$ through the negative film.

The exposure intensity in this procedure was measured using a UV luminometer MO-2 manufactured by ORC Manufacturing Co., Ltd., which is equipped with a filter UV-35. The measured intensity of the ultraviolet rays from a lamp on the lower side for the back exposure on a glass plate was 10.3 mW/cm$^2$, whereas the measured intensity of the ultraviolet rays from a lamp on the upper side for the relief exposure was 12.5 mW/cm$^2$.

Subsequently, the obtained plate was attached with a double-sided adhesive tape onto a rotating cylinder of a developing machine AFP-1500 (trade name, manufactured by Asahi Kasei Chemicals Corp.) using 3-methoxybutyl acetate as a developing solution. The plate was subjected to development at a liquid temperature of 25° C. for 5 minutes and dried at 60° C. for 2 hours. Then, in post-exposure, the whole surface of the plate was exposed at an integrated exposure light amount of 2,000 mJ/cm$^2$ using a germicidal lamp having a center wavelength of 254 nm, and successively exposed at an integrated exposure light amount of 1,000 mJ/cm$^2$ using an ultraviolet fluorescent lamp to obtain a flexographic printing plate. In this context, the post-exposure light amount by the germicidal lamp was calculated from the illuminance measured using the MO-2 machine equipped with a UV-25 filter.

(4) Evaluation Method (4-1) Fine Line Reproducibility

The relief image obtained in the above (3) was evaluated with a microscope for the shapes of concave fine lines and convex fine lines of 500 µm in width. Images giving concave fine lines with a deep depth and sharp unthickened convex fine lines are expressed as fair, whereas those giving concave fine lines with a shallow depth and thickened convex fine lines that are not sharp are expressed as poor.

(4-2) Ester Solvent Resistance (4-2-1) Thickness Change

The printing plate obtained in the above (3) was immersed in 20 wt % ethyl acetate-isopropyl alcohol solution for 6 hours. Then, a thickness change (mm) was measured. Those having a smaller thickness change are regarded as having higher ester solvent resistance.

(4-2-2) Chipping Resistance

The mechanical strength of character parts on the printing plate swelling by flexographic inks was evaluated in a model experiment. A printing plate having a character size of 8 points to 12 points was prepared by the method shown in the above (3) and immersed in 20 wt % ethyl acetate-isopropyl alcohol solution for 4 hours. Then, the degree of destruction of characters after scrubbing 300 times crosswise using an NP-type printing durability tester (trade name, manufactured by Niimura Printing Co., Ltd., contacting body: cloth, load: 1 kg) was observed with a microscope. Those having no destruction of characters are expressed as good, those having the destruction of only 8-point characters are expressed as fair, and those also having the destruction of 12-point characters are expressed as poor.

(4-3) Cracks Occurring on Plate Surface

In the post-exposure of the above (3), the whole surface of the plate was exposed at an integrated exposure light amount increased to 3,000 mJ/cm$^2$ using a germicidal lamp having a center wavelength of 254 nm, and successively exposed at an integrated exposure light amount of 1,000 mJ/cm$^2$ using an ultraviolet fluorescent lamp. The presence or absence of cracks on the surface of the resulting printing plate was observed after printing of 100,000 m and 200,000 m at a printing speed of 120 m/min. using XS-716 (trade name, manufactured by Dainippon Ink and Chemicals, Incorporated) as ester solvent-containing inks and low density polyethylene (0.04 mm in thickness) as a substrate to be printed on. Those having cracks occurring after printing of 100,000 m are expressed as poor, those having cracks occurring after printing of 200,000 m are expressed as fair, and those having no cracks occurring even after printing of 200,000 m are expressed as good.

Examples 1 to 4 and Comparative Examples 1 to 3

The evaluation test results of Examples 1 to 4 and Comparative Examples 1 to 3 are shown in Table 1.

The photosensitive resin compositions comprising a thermoplastic elastomer comprising at least vinyl aromatic hydrocarbon units, butadiene units, and alkylene units and comprising alkylene units of 5 wt % to 80 wt % with respect to the total amount of butadiene units and alkylene units were demonstrated to simultaneously achieve excellent fine line reproducibility, ester solvent resistance, and prevention of cracks occurring on plate surface.

Among them, Examples 1 and 2 having alkylene units not less than 10 wt % and not more than 50 wt % with respect to the total amount of butadiene units and alkylene units were good from the viewpoint of the prevention of cracks occurring on plate surface. Example 3 having alkylene units of 23 wt % was best from the viewpoint of the chipping resistance of the printing plate.

TABLE 1

|  |  |  |  |  |  |  |  |  |  | (part by weight) |
|---|---|---|---|---|---|---|---|---|---|---|
|  | Composition | Alkylene unit amount in total amount of butadiene units and alkylene units | Ex. 1 | Ex. 2 | Ex. 3 | Ex. 4 | Comp. Ex. 1 | Comp. Ex. 2 | Comp. Ex. 3 |
| (a) Elastomer | Hydrogenated thermoplastic elastomer A (Ref. Ex. 1-1) | 45 wt % | 87 | 86 |  |  |  |  |  |
|  | Hydrogenated thermoplastic elastomer B (Ref. Ex. 1-2) | 23 wt % |  |  | 87 |  |  |  |  |
|  | Hydrogenated thermoplastic elastomer C (Ref. Ex. 1-3) | 53 wt % |  |  |  | 87 |  |  |  |
|  | Hydrogenated thermoplastic elastomer D (Ref. Ex. 1-4) | 99 wt % |  |  |  |  |  |  | 87 |
|  | Unhydrogenated thermoplastic elastomer E (Ref. Ex. 1-5) | 0 wt % |  |  |  |  | 87 |  |  |
|  | Styrene-isoprene block copolymer *1 | 0 wt % |  |  |  |  |  | 87 |  |
| (b) Photopolymerizable unsaturated monomer | 1,9-nonanediol diacrylate | | 10 | 7 | 10 | 10 | 10 | 10 | 10 |
|  | 1,6-hexanediol dimethacrylate | |  | 4 |  |  |  |  |  |
| (c) Photopolymerization initiator | 2,2-dimethoxy-phenylacetophenone | | 3 | 3 | 3 | 3 | 3 | 3 | 3 |
| (d) Plasticizer | B2000 | | 20 | 20 | 20 | 20 | 20 | 20 | 20 |
|  | LIR305 | | 13 | 13 | 13 | 13 | 13 | 13 | 13 |
| (4-1) Fine line reproducibility | | | fair | fair | fair | fair | fair | fair | poor |

TABLE 1-continued

| Composition | Alkylene unit amount in total amount of butadiene units and alkylene units | Ex. 1 | Ex. 2 | Ex. 3 | Ex. 4 | Comp. Ex. 1 | Comp. Ex. 2 | Comp. Ex. 3 |
|---|---|---|---|---|---|---|---|---|
| (4-2-1) Ester solvent resistance-Thickness change attributed to swelling (mm) | | 0.05 | 0.06 | 0.06 | 0.05 | 0.10 | 0.06 | 0.06 |
| (4-2-2) Ester solvent resistance-Chipping resistance | | fair | fair | good | fair | poor | poor | poor |
| (4-3) Cracks occurring on plate surface | | good | good | good | fair | fair | poor | poor |

*1 D1161 (trade name, manufactured by KRATON, styrene content: 15 wt %)

INDUSTRIAL APPLICABILITY

The present invention can provide a photosensitive resin composition with (1) high fine line reproducibility, (2) high ester solvent resistance, and (3) few cracks occurring on plate surface.

The invention claimed is:

1. A photosensitive resin composition comprising at least a thermoplastic elastomer (a), a photopolymerizable unsaturated monomer (b), and a photopolymerization initiator (c), characterized in that the thermoplastic elastomer (a) comprises at least vinyl aromatic hydrocarbon units, butadiene units, and alkylene units and contains alkylene units not less than 10 wt % and not more than 50 wt % with respect to the total amount of butadiene units and alkylene units, and the alkylene units are hydrogenated butadiene units.

2. The photosensitive resin composition according to claim 1, characterized in that the thermoplastic elastomer (a) contains alkylene units not less than 10 wt % and not more than 40 wt % with respect to the total amount of butadiene units and alkylene units.

3. The photosensitive resin composition according to claim 1, characterized in that the thermoplastic elastomer (a) comprises a block mainly composed of vinyl aromatic hydrocarbon units and a block mainly composed of butadiene units and alkylene units and contains alkylene units not less than 10 wt % and not more than 50 wt % with respect to the amount of the block mainly composed of butadiene units and alkylene units.

4. The photosensitive resin composition according to claim 1, characterized in that the amount of vinyl aromatic hydrocarbon units in the thermoplastic elastomer (a) is not less than 10 wt % and not more than 40 wt %.

5. The photosensitive resin composition according to claim 1, characterized in that the amount of 1,2-bond units from butadiene contained in the thermoplastic elastomer (a) is not less than 1 wt % and not more than 70 wt %.

6. The photosensitive resin composition according to claim 1, characterized in that the total amount of 1,2-bond units from butadiene and butylene units contained in the thermoplastic elastomer (a) ranges from not less than 20 wt % to not more than 80 wt %.

7. The photosensitive resin composition according to claim 1, characterized in that the photosensitive resin composition comprises the thermoplastic elastomer (a) in an amount not less than 10 wt % and not more than 85 wt %, the photopolymerizable unsaturated monomer (b) in an amount not less than 0.5 wt % and not more than 50 wt %, and the photopolymerization initiator (c) in an amount not less than 0.1 wt % and not more than 45 wt %, when the amounts of the thermoplastic elastomer (a), the photopolymerizable unsaturated monomer (b), and the photopolymerization initiator (c) are summed up.

8. The photosensitive resin composition according to claim 1, characterized in that the photosensitive resin composition comprises a conjugated diene rubber containing 1,2-bond units in an amount not less than 40 mol % and having a viscosity not more than 2,000 (Pa-s) at 30° C.

9. The photosensitive resin composition according to claim 8, characterized in that all kinds of the conjugated diene rubbers in the photosensitive resin composition contain 1,2-bond units not less than 40 mol % on average, and having a viscosity is not more than 2,000 (Pa-s) at 30° C.

10. The photosensitive resin composition according to claim 1, characterized in that the photosensitive resin composition comprises a conjugated diene rubber having a viscosity not more than 2,000 (Pa-s) at 30° C. in an amount not less than 4 parts by weight and not more than 40 parts by weight with respect to 100 parts by weight in total of the amounts of the thermoplastic elastomer (a), the photopolymerizable unsaturated monomer (b), and the photopolymerization initiator (c).

11. A raw plate for flexography having a layer comprising a photosensitive resin composition according to claim 1.

12. The raw plate for flexography according to claim 11, further having an ultraviolet blocking layer on the layer of the photosensitive resin composition.

13. A raw plate for flexography having a layer comprising a photosensitive resin composition according to claim 2.

14. A raw plate for flexography having a layer comprising a photosensitive resin composition according to claim 3.

15. A raw plate for flexography having a layer comprising a photosensitive resin composition according to claim 4.

16. A raw plate for flexography having a layer comprising a photosensitive resin composition according to claim 5.

17. A raw plate for flexography having a layer comprising a photosensitive resin composition according to claim 6.

18. A raw plate for flexography having a layer comprising a photosensitive resin composition according to claim 7.

19. A raw plate for flexography having a layer comprising a photosensitive resin composition according to claim 8.

20. A raw plate for flexography having a layer comprising a photosensitive resin composition according to claim 9.

21. A raw plate for flexography having a layer comprising a photosensitive resin composition according to claim 10.

* * * * *

UNITED STATES PATENT AND TRADEMARK OFFICE
CERTIFICATE OF CORRECTION

Page 1 of 1

PATENT NO. : 7,785,765 B2
APPLICATION NO. : 11/913173
DATED : August 31, 2010
INVENTOR(S) : Masahiro Fujiwara It is certified that error appears in the above-identified patent and that said Letters Patent is hereby corrected as shown below:

In claim 9, column 18, Line 27, after "viscosity", delete "is".

Signed and Sealed this
Twenty-second Day of March, 2011

David J. Kappos
*Director of the United States Patent and Trademark Office*